United States Patent
Kim et al.

(10) Patent No.: US 11,795,185 B2
(45) Date of Patent: Oct. 24, 2023

(54) COMPOUND FOR ELECTRON-TRANSPORT MATERIAL AND ORGANIC LIGHT EMITTING DIODE INCLUDING THE SAME

(71) Applicant: LG Display Co., Ltd., Seoul (KR)

(72) Inventors: Dohan Kim, Goyang-si (KR); Hyeseung Kang, Seoul (KR); Seonkeun Yoo, Gunpo-si (KR)

(73) Assignee: LG Display Co., Ltd., Seoul (KR)

( * ) Notice: Subject to any disclaimer, the term of this patent is extended or adjusted under 35 U.S.C. 154(b) by 479 days.

(21) Appl. No.: 16/216,647

(22) Filed: Dec. 11, 2018

(65) Prior Publication Data
US 2019/0177349 A1  Jun. 13, 2019

(30) Foreign Application Priority Data
Dec. 13, 2017  (KR) .......... 10-2017-0171251

(51) Int. Cl.
*C07F 9/6521* (2006.01)
*C07F 9/655* (2006.01)
(Continued)

(52) U.S. Cl.
CPC ........ *C07F 9/6521* (2013.01); *C07F 9/65517* (2013.01); *C07F 9/65586* (2013.01);
(Continued)

(58) Field of Classification Search
CPC .............. C07F 9/6521; C07F 9/65586; C07F 9/65517; H01L 51/5076; H01L 51/5092;
(Continued)

(56) References Cited

U.S. PATENT DOCUMENTS 5,972,247 A   10/1999  Shi et al.
6,225,467 B1  5/2001   Esteghamatian et al.
(Continued)

FOREIGN PATENT DOCUMENTS

CN  102498120 A  6/2012
CN  103951657 A  7/2014
(Continued)

OTHER PUBLICATIONS

Sci China Chem, 2020, 63: 904-910. (Year: 2020).*
(Continued)

*Primary Examiner* — Dawn L Garrett
(74) *Attorney, Agent, or Firm* — SEED IP LAW GROUP LLP

(57) ABSTRACT

Disclosed herein is a compound for electron transport material and an organic light emitting diode including the same. The compound for electron transport material is represented by the following Formula 1. Since the compound for electron transport material, as represented by Formula 1, contains a triazine structure, the compound has high electron
(Continued)

mobility and is thus suitable as an electron transport material. The organic light emitting diode includes an electron transport layer formed of the compound as represented by Formula 1 and thus can have increased lifespan.

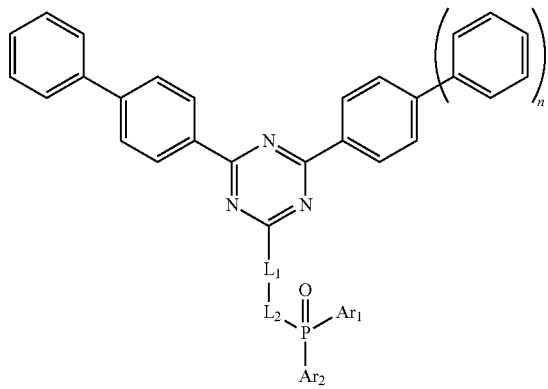

3 Claims, 3 Drawing Sheets

(51) Int. Cl.
*C07F 9/6558* (2006.01)
*H10K 50/11* (2023.01)
*H10K 50/18* (2023.01)
*H10K 50/165* (2023.01)
*H10K 50/17* (2023.01)
*H10K 85/30* (2023.01)
*H10K 85/60* (2023.01)
*H10K 50/15* (2023.01)
*H10K 50/16* (2023.01)
*H10K 101/10* (2023.01)

(52) U.S. Cl.
CPC .......... *H10K 50/11* (2023.02); *H10K 50/165* (2023.02); *H10K 50/171* (2023.02); *H10K 50/18* (2023.02); *H10K 85/30* (2023.02); *H10K 85/615* (2023.02); *H10K 85/654* (2023.02); *H10K 85/6574* (2023.02); *H10K 50/15* (2023.02); *H10K 50/16* (2023.02); *H10K 2101/10* (2023.02)

(58) Field of Classification Search
CPC .......... H01L 51/5096; H01L 51/5016; H01L 51/0073; H01L 51/0052; H01L 51/0077; H01L 51/0067; H01L 51/5056; H01L 51/5072; H10K 50/11; H10K 50/165; H10K 50/171; H10K 50/18; H10K 85/30; H10K 85/615; H10K 85/654; H10K 85/6574; H10K 2101/10; H10K 50/15; H10K 50/16; H10K 85/649
See application file for complete search history.

(56) References Cited

U.S. PATENT DOCUMENTS

| | | | |
|---|---|---|---|
| 6,638,646 B2 | 10/2003 | Spreitzer et al. | |
| 6,821,643 B1 | 11/2004 | Hu et al. | |
| 7,192,659 B2 | 3/2007 | Ricks et al. | |
| 7,288,330 B2 | 10/2007 | Hatwar et al. | |
| 7,811,681 B2 | 10/2010 | Kim et al. | |
| 8,039,123 B2 | 10/2011 | Ragini et al. | |
| 8,273,467 B2 | 9/2012 | Sano et al. | |
| 8,318,948 B2 | 11/2012 | Bae et al. | |
| 8,586,210 B2 | 11/2013 | Yokoyama et al. | |
| 8,609,257 B2 | 12/2013 | Ise et al. | |
| 8,772,632 B2 | 7/2014 | In et al. | |
| 8,906,893 B2 | 12/2014 | Anémian et al. | |
| 8,999,522 B2 | 4/2015 | Cheng et al. | |
| 9,136,480 B2 | 9/2015 | Kim et al. | |
| 9,203,043 B2 | 12/2015 | Nishimura et al. | |
| 9,231,220 B2 | 1/2016 | Anémian et al. | |
| 9,276,227 B2 | 3/2016 | Kim et al. | |
| 9,324,954 B2 | 4/2016 | Parham et al. | |
| 9,773,982 B2 | 9/2017 | Noda et al. | |
| 2004/0058193 A1 | 3/2004 | Hatwar | |
| 2005/0112405 A1 | 5/2005 | Hamada | |
| 2005/0123799 A1 | 6/2005 | Hamada | |
| 2006/0135766 A1 | 6/2006 | Hayoz et al. | |
| 2008/0238307 A1* | 10/2008 | Tobise | H01L 51/005 313/504 |
| 2009/0072727 A1 | 3/2009 | Takeda | |
| 2009/0102373 A1 | 4/2009 | Hayoz et al. | |
| 2010/0171418 A1 | 7/2010 | Kinoshita et al. | |
| 2011/0260153 A1 | 10/2011 | In et al. | |
| 2012/0126221 A1 | 5/2012 | Kitamura et al. | |
| 2012/0126692 A1 | 5/2012 | Ise et al. | |
| 2012/0168735 A1* | 7/2012 | Pflumm | H01L 51/5048 257/40 |
| 2012/0298980 A1 | 11/2012 | Sano et al. | |
| 2013/0161590 A1 | 6/2013 | Yun et al. | |
| 2013/0234119 A1 | 9/2013 | Mizuki et al. | |
| 2013/0264548 A1 | 10/2013 | Mizuki et al. | |
| 2013/0292654 A1 | 11/2013 | Matsunaga et al. | |
| 2013/0341604 A1 | 12/2013 | Yokoyama et al. | |
| 2014/0027744 A1 | 1/2014 | Yoshida et al. | |
| 2014/0048745 A1* | 2/2014 | Anemian | H01L 51/5072 252/500 |
| 2014/0197401 A1* | 7/2014 | Kroeber | H01L 51/56 257/40 |
| 2014/0252333 A1 | 9/2014 | Watanabe et al. | |
| 2014/0319507 A1 | 10/2014 | Yamamoto et al. | |
| 2014/0332790 A1 | 11/2014 | Fadhel et al. | |
| 2014/0361258 A1 | 12/2014 | Hwang et al. | |
| 2014/0367656 A1 | 12/2014 | Kim et al. | |
| 2015/0090964 A1 | 4/2015 | Hwang et al. | |
| 2015/0102301 A1 | 4/2015 | Cho et al. | |
| 2015/0155501 A1 | 6/2015 | Xia et al. | |
| 2015/0155514 A1* | 6/2015 | Kaiser | H01L 51/56 438/46 |
| 2015/0214489 A1 | 7/2015 | Parham et al. | |
| 2015/0236264 A1 | 8/2015 | Kim et al. | |
| 2015/0380662 A1 | 12/2015 | Kim et al. | |
| 2016/0028017 A1 | 1/2016 | Kim et al. | |
| 2016/0035982 A1 | 2/2016 | Itabashi et al. | |
| 2016/0087216 A1 | 3/2016 | Kim et al. | |
| 2016/0126472 A1 | 5/2016 | Oh et al. | |
| 2016/0141505 A1 | 5/2016 | Park et al. | |
| 2016/0204359 A1 | 7/2016 | Lee et al. | |
| 2016/0260907 A1 | 9/2016 | Low et al. | |
| 2016/0293852 A1 | 10/2016 | Huh et al. | |
| 2016/0380203 A1 | 12/2016 | Jenekhe et al. | |
| 2017/0098780 A1 | 4/2017 | Kim et al. | |
| 2017/0098784 A1 | 4/2017 | Kim et al. | |
| 2017/0186967 A1 | 6/2017 | Hayashi et al. | |
| 2017/0256720 A1 | 9/2017 | Adachi et al. | |
| 2018/0287072 A1 | 10/2018 | Park et al. | |
| 2018/0354913 A1* | 12/2018 | Jung | C07D 251/24 |

FOREIGN PATENT DOCUMENTS

| | | |
|---|---|---|
| CN | 104447866 A | 3/2015 |
| CN | 104447878 A | 3/2015 |
| CN | 103087103 B | 7/2015 |
| CN | 10-2016-0050894 A | 5/2016 |
| CN | 106699811 A | 5/2017 |
| CN | 10-2017-0070640 A | 6/2017 |
| CN | 106883268 A | 6/2017 |
| CN | 106905366 A | 6/2017 |
| EP | 2 336 130 A1 | 6/2011 |

(56) References Cited

FOREIGN PATENT DOCUMENTS

| | | |
|---|---|---|
| EP | 2 651 904 B1 | 11/2014 |
| EP | 3035400 A1 * | 6/2016 |
| EP | 3 072 943 A1 | 9/2016 |
| JP | 2004-536037 A | 12/2004 |
| JP | 2009-094486 A | 4/2009 |
| JP | 4590020 B1 | 12/2010 |
| JP | 2011-071459 A | 4/2011 |
| JP | 2011-176250 A | 9/2011 |
| JP | 2011-176258 A | 9/2011 |
| JP | 2011-210749 A | 10/2011 |
| JP | 2011-219444 A | 11/2011 |
| JP | 2011-256143 A | 12/2011 |
| JP | 2012-028711 A | 2/2012 |
| JP | 2012-049523 A | 3/2012 |
| JP | 2012-174901 A | 9/2012 |
| JP | 5366106 B1 | 12/2013 |
| JP | 2014-125449 A | 7/2014 |
| JP | 5560592 B2 | 7/2014 |
| JP | 5719125 B2 | 5/2015 |
| JP | 2015-167150 A | 9/2015 |
| JP | 5814031 B2 | 11/2015 |
| JP | 6109137 B2 | 4/2017 |
| JP | 2018-531896 A | 11/2018 |
| KR | 10-2000-0051826 A | 8/2000 |
| KR | 10-2011-0076892 A | 7/2011 |
| KR | 10-2011-0108313 A | 10/2011 |
| KR | 10-2012-0025006 A | 3/2012 |
| KR | 10-1233368 B1 | 2/2013 |
| KR | 10-2013-0060157 A | 6/2013 |
| KR | 10-2014-0076520 A | 6/2014 |
| KR | 10-2014-0082437 A | 7/2014 |
| KR | 10-2014-0090036 A | 7/2014 |
| KR | 10-2014-0090410 A | 7/2014 |
| KR | 10-2014-0094408 A | 7/2014 |
| KR | 10-2015-0014368 A | 2/2015 |
| KR | 10-1492527 B1 | 2/2015 |
| KR | 10-1492531 B1 | 2/2015 |
| KR | 10-2015-0031396 A | 3/2015 |
| KR | 10-2015-0108330 A | 9/2015 |
| KR | 101554591 B1 | 9/2015 |
| KR | 10-1558966 B1 | 10/2015 |
| KR | 10-1566530 B1 | 11/2015 |
| KR | 10-1593368 B1 | 2/2016 |
| KR | 10-2016-0028979 A | 3/2016 |
| KR | 10-2016-0079545 A | 7/2016 |
| KR | 10-2016-0085603 A | 7/2016 |
| KR | 10-2017-0032850 A | 3/2017 |
| KR | 10-2017-0040697 A | 4/2017 |
| KR | 10-1724303 B1 | 4/2017 |
| WO | 02/068417 A2 | 9/2002 |
| WO | 2004/050794 A1 | 6/2004 |
| WO | 2011/021433 A1 | 2/2011 |
| WO | 2011/081403 A2 | 7/2011 |
| WO | 2012/002221 A1 | 1/2012 |
| WO | 2012/005360 A1 | 1/2012 |
| WO | 2012/015017 A1 | 2/2012 |
| WO | 2012/133042 A1 | 10/2012 |
| WO | 2013/032297 A1 | 3/2013 |
| WO | 2013/047517 A1 | 4/2013 |
| WO | 2013/077344 A1 | 5/2013 |
| WO | 2013/145923 A1 | 10/2013 |
| WO | 2014/017094 A1 | 1/2014 |
| WO | 2014/142488 A1 | 9/2014 |
| WO | 2014/189122 A1 | 11/2014 |
| WO | 2015/016498 A1 | 2/2015 |
| WO | 2015/089028 A1 | 6/2015 |
| WO | 2016/013867 A1 | 1/2016 |
| WO | 2016/036171 A1 | 3/2016 |
| WO | 2017/032439 A1 | 3/2017 |
| WO | 2017/099490 A1 | 6/2017 |
| WO | WO-2017105039 A1 * | 6/2017 ........... C07D 251/12 |
| WO | 2017/178311 A1 | 10/2017 |

OTHER PUBLICATIONS

J. Mater. Chem. C, 2015, 3, pp. 4890-4902. (Year: 2015).*
Chem. Mater., (2010), vol. 22, pp. 5678-5686. (Year: 2010).*
Machine translation of WO-2017105039-A1 (publication date Jun. 2017). (Year: 2017).*
Jeon, S. O., & Lee, J. Y. (2012). Phosphine oxide derivatives for organic light emitting diodes. Journal of Materials Chemistry, 22(10), 4233-4243. (Year: 2012).*
Jia, J., Zhu, L., Wei, Y., Wu, Z., Xu, H., Ding, D., Chen, R., Ma, D. and Huang, W., 2015. Triazine-phosphine oxide electron transporter for ultralow-voltage-driven sky blue PHOLEDs. Journal of Materials Chemistry C, 3(19), pp. 4890-4902. (Year: 2015).*
Registry (STN)[online], "Benzonitrile, 3,5-di-4-pyridinyl & 3,5-di-3-pyridinyl", GAS Registration No. 1214365-51-1 anc~214362-42-1, Supplier: HE Chemical Co., Ltd., Mar. 25, 2010.
W. Li et al., Abstract of "Bipolar host materials for high-efficiency blue phosphorescent and delayed-fluorescence OLEDs," *Royal Society of Chemistry, Journal of Materials Chemistry C*, vol. 3, No. 48, Jan. 1, 2015.
Office Action (Non-Final Rejection), dated Feb. 20, 2020, for U.S. Appl. No. 15/736,593, Jung et al., "Novel Heterocyclic Compound and Organic Light Emitting Device Compromising the Same," 9 pages.
Final Office Action (Final Rejection), dated Jul. 23, 2020, for U.S. Appl. No. 15/736,593, Jung et al., "Novel Heterocyclic Compound and Organic Light Emitting Device Compromising the Same," 8 pages.
U.S. Appl. No. 15/736,593, filed Jul. 20, 2017
US 2018-0354913 A1, Published Dec. 13, 2018.
Office Action, dated Jul. 8, 2021, for U.S. Appl. No. 15/736,593, Jung et al., "Novel Heterocyclic Compound and Organic Light Emitting Device Comprising the Same," 16 pages.
Office Action, dated Jan. 19, 2022, for U.S. Appl. No. 15/736,593, Jung et al., "Novel Heterocyclic Compound and Organic Light Emitting Device Comprising the Same," 9 pages.
Office Action, dated May 24, 2022, for U.S. Appl. No. 15/736,593, Jung et al., "Novel Heterocyclic Compound and Organic Light Emitting Device Comprising the Same," 10 pages.
Office Action, dated May 24, 2023, for U.S. Appl. No. 15/736,593, Jung et al., "Novel Heterocyclic Compound and Organic Light Emitting Device Comprising the Same," 10 pages.
Office Action, dated Nov. 10, 2020 for U.S. Appl. No. 15/736,593, Jung et al., "Novel Heterocyclic Compound and Organic Light Emitting Device Comprising the Same," 3 pages.
Office Action, dated Nov. 8, 2022 for U.S. Appl. No. 15/736,593, Jung et al., "Novel Heterocyclic Compound and Organic Light Emitting Device Comprising the Same," 9 pages.

* cited by examiner

100

200

COMPOUND FOR ELECTRON-TRANSPORT MATERIAL AND ORGANIC LIGHT EMITTING DIODE INCLUDING THE SAME

CROSS-REFERENCE TO RELATED APPLICATIONS

This application claims the priority of Korean Patent Application No. 10-2017-0171251 filed on Dec. 13, 2017, in the Korean Intellectual Property Office, the disclosure of which is hereby incorporated by reference in its entirety.

BACKGROUND

Description of the Related Art

Various materials have been developed for electron transport layers (ETLs) of OLEDs since C. W. Tang used Alq3 (1) as an electron-transporting luminescent material (Appl. Phys. Lett., 1987). A material for electron transport layers needs to allow proper control of injection and transport of electrons to achieve charge balance in an OLED and also needs to retain original structure thereof without degeneration even upon repeatedly undergoing reduction and oxidation caused by transport of electrons during operation of the OLED.

Besides electrical stability, thermal stability of the material for electron transport layers is also important. J. Kido et al. developed a compound (2) that has a structure in which a pyridine group is bonded to a benzene backbone and has electron mobility 101 to 102 times that of typical materials for electron transport layers, thereby drastically improving electron mobility of organic semiconductors. However, such a compound has a low glass transition temperature and cannot guarantee stable operation of an OLED.

Recently, there has been developed a material for electron transport layers, which can meet high triplet energy requirements for improvement in luminous efficacy of a fluorescent device via triplet-triplet fusion (TTF) or optimization of a recombination zone of a phosphorescent device.

BRIEF SUMMARY

It is an aspect of the present disclosure to provide a material for an electron transport layer, which is obtained by introducing a phosphine oxide group into a triazine compound and has high triplet energy while exhibiting good properties in terms of electron mobility and thermal stability.

It is another aspect of the present disclosure to provide an organic light emitting diode which has increased lifespan and good heat resistance.

The above and other aspects and advantages of the present disclosure will become apparent from the detailed description of the following embodiments in conjunction with the accompanying drawings. In addition, it should be understood that the above and other aspects and advantages of the present disclosure may be realized through features set forth in the appended claims or combinations thereof.

In accordance with one aspect of the present disclosure, a compound for electron transport material is represented by Formula 1:

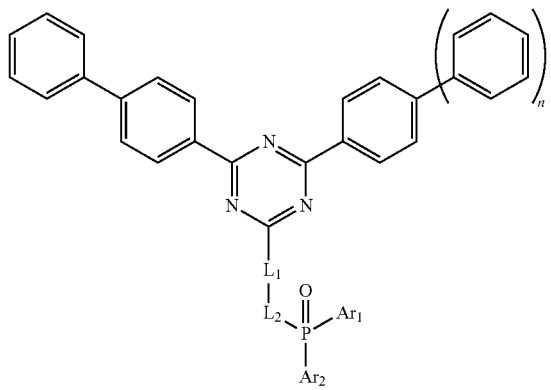

wherein $L_1$ is a substituted or unsubstituted $C_1$ to $C_6$ alkylene group, a substituted or unsubstituted $C_3$ to $C_6$ cycloalkylene group, a substituted or unsubstituted $C_6$ to $C_{20}$ arylene group, or a substituted or unsubstituted $C_5$ to $C_{20}$ heteroarylene group;

$L_2$ is a substituted or unsubstituted phenylene group or a substituted or unsubstituted naphthylene group;

$Ar_1$ and $Ar_2$ are each independently a substituted or unsubstituted $C_6$ to $C_{20}$ aryl group; and n is 0 or 1.

In accordance with another aspect of the present disclosure, an organic light emitting diode includes: an anode; a light emitting layer; an organic layer; and a cathode, wherein the organic layer includes an electron transport layer interposed between the light emitting layer and the cathode, the electron transport layer including the compound for electron transport material set forth above.

The present disclosure provides a compound for electron transport material which exhibits high electron mobility while having good properties in terms of electrical and thermal stability.

The present disclosure provides an organic light emitting diode which includes the compound for electron transport material set forth above and thus can have increased lifespan.

It should be understood that the present disclosure is not limited to the aforementioned effects and various other effects will be apparent to those skilled in the art through features of the present disclosure.

LIST OF MAIN REFERENCE NUMERALS

Figure 1:
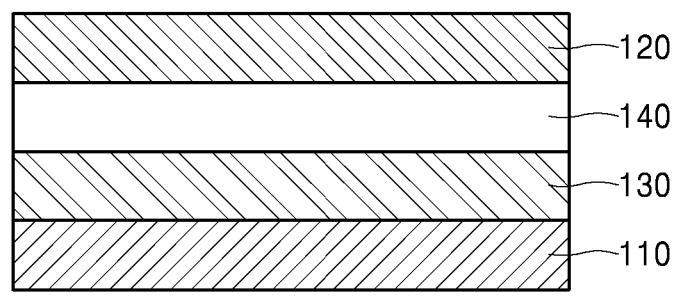
FIG. 1 shows an organic light emitting diode according to one embodiment of the present disclosure.

100, 200, 300: organic light emitting diode
110, 210, 310: anode
120, 220, 320: cathode
130, 230, 330: light emitting layer 140, 240, 340: organic layer
341: hole injection layer
342: hole transport layer
343: electron transport layer
344: electron injection layer

DETAILED DESCRIPTION

Hereinafter, embodiments of the present disclosure will be described in detail with reference to the accompanying drawings such that the technical idea of the present disclosure can be easily realized by those skilled in the art. It should be understood that the present disclosure is not limited to the following embodiments and may be embodied in different ways.

In the drawings, portions irrelevant to the description will be omitted for clarity and like components will be denoted by like reference numerals throughout the specification. In addition, description of known functions and constructions which may unnecessarily obscure the subject matter of the present disclosure will be omitted.

It will be understood that, when an element such as a layer, film, region or substrate is referred to as being placed "above"/"below" or "on"/"under" another element, it can be directly placed on the other element, or intervening layer(s) may also be present. It will be understood that, although the terms "first", "second", "A", "B", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a "first" element or component discussed below could also be termed a "second" element or component, or vice versa, without departing from the scope of the present disclosure. When an element or layer is referred to as being "on," "connected to," or "coupled to" another element or layer, it may be directly on, connected to, or coupled to the other element or layer or intervening elements or layers may be present. However, when an element or layer is referred to as being "directly on," "directly connected to," or "directly coupled to" another element or layer, there are no intervening elements or layers present.

As used herein, unless otherwise stated, the term "substituted" means to be substituted with a substituent selected from the group consisting of a $C_1$ to $C_{12}$ alkyl group (preferably $C_1$ to $C_6$ alkyl group), an amino group, a nitrile group, a $C_3$ to $C_7$ cycloalkyl group, a $C_2$ to $C_{12}$ alkenyl group (preferably $C_2$ to $C_6$ alkenyl group), a $C_3$ to $C_7$ cycloalkenyl group, a $C_2$ to $C_{50}$ alkynyl group (preferably $C_2$ to $C_6$ alkynyl group), a $C_5$ to $C_{50}$ cycloalkynyl group (preferably $C_5$ to $C_{12}$ cycloalkynyl group), a cyano group, a $C_1$ to $C_{12}$ alkoxy group (preferably $C_1$ to $C_6$ alkoxy group), a $C_6$ to $C_{60}$ aryl group (preferably $C_6$ to $C_{14}$ aryl group), a $C_7$ to $C_{60}$ arylalkyl group (preferably $C_7$ to $C_{20}$ arylalkyl group), a $C_5$ to $C_{60}$ heteroaryl group (preferably $C_5$ to $C_{14}$ heteroaryl group) and combinations thereof. Optionally, the aryl group, arylalkyl group or heteroaryl group may have a fused ring.

As used herein, unless otherwise stated, the term "combinations thereof", when referring to a substituent, means that two or more substituents are bonded to one another via a linking group or that two or more substituents are condensed with one another.

As used herein, unless otherwise stated, the term "hetero" means that one compound or substituent contains a hetero atom which may be selected from the group consisting of N, O, S, P, and combinations thereof. For example, "hetero" may mean that one compound or substituent contains 1 to 3 hetero atoms and the other atoms in the substituent are carbon.

As used herein, "*" in a specific structural formula denotes a region to which the same or different atom or formula is linked.

In accordance with one aspect of the present disclosure, there is provided a compound for electron transport material, as represented by Formula 1:

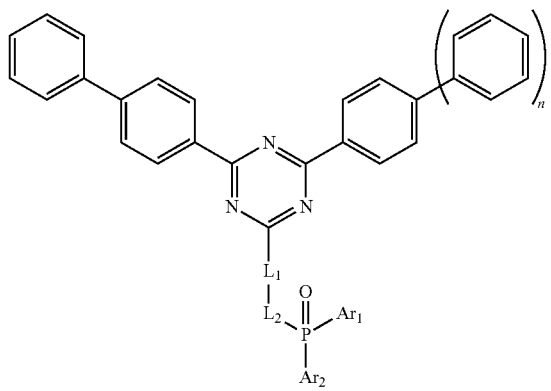

wherein $L_1$ is a substituted or unsubstituted $C_1$ to $C_6$ alkylene group, a substituted or unsubstituted $C_3$ to $C_6$ cycloalkylene group, a substituted or unsubstituted $C_6$ to $C_{20}$ arylene group, or a substituted or unsubstituted $C_5$ to $C_{20}$ heteroarylene group;

$L_2$ is a substituted or unsubstituted phenylene group or a substituted or unsubstituted naphthylene group;

$Ar_1$ and $Ar_2$ are each independently a substituted or unsubstituted $C_6$ to $C_{20}$ aryl group; and n is 0 or 1.

Since the compound for electron transport material, as represented by Formula 1, contains a triazine structure, the compound has high electron mobility and is thus suitable as an electron transport material.

In addition, the compound for electron transport material, as represented by Formula 1, can have an increased glass transition temperature through introduction of a phosphine oxide group. If only the structure in which benzene rings are linked to form a single bond is present in the compound represented by Formula 1, the compound for electron transport material can have a low glass transition temperature of 100° C. or less.

Since introduction of the phosphine oxide group increases the glass transition temperature of the compound for electron transport material, the compound has good electrical and thermal stability while securing high triplet energy. Accordingly, when applied to an organic light emitting diode, the compound for electron transport material represented by Formula 1 can increase lifespan of the organic light emitting diode.

In one embodiment, the compound represented by Formula 1 may have a glass transition temperature of 110° C. to 140° C., specifically 120° C. to 140° C.

Specifically, $L_1$ in Formula 1 may be any one of groups represented by the following structural formulae:

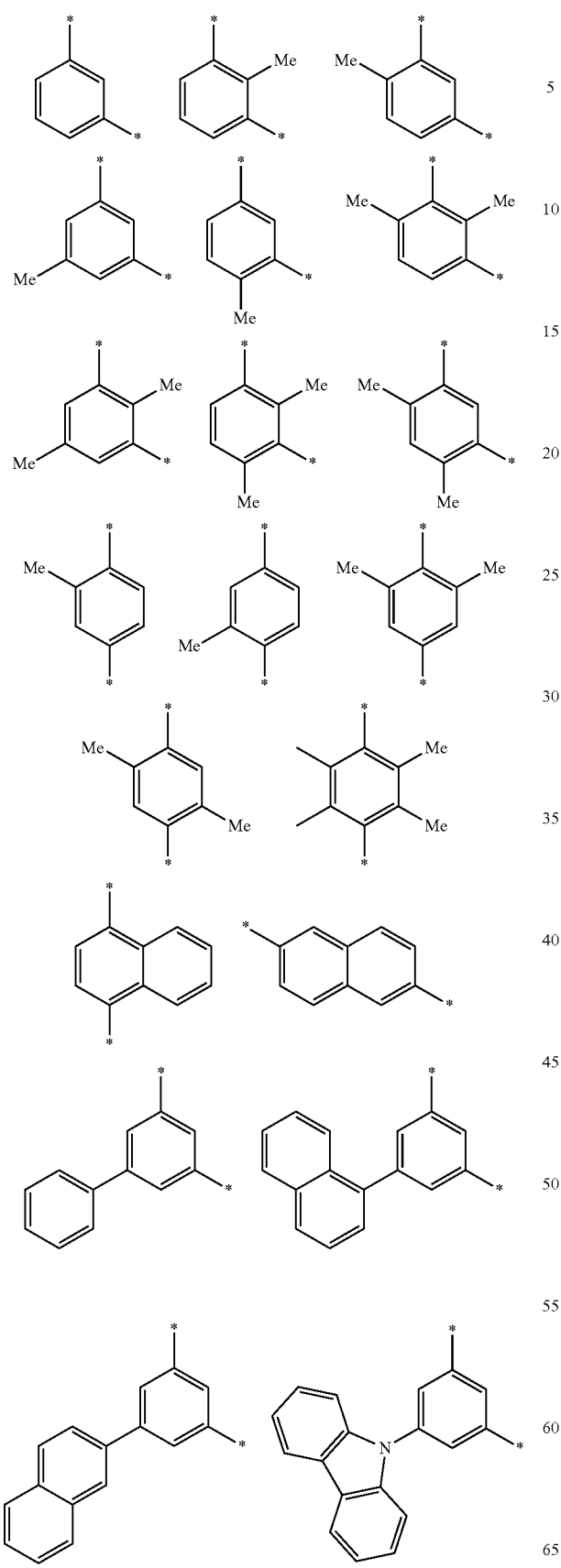

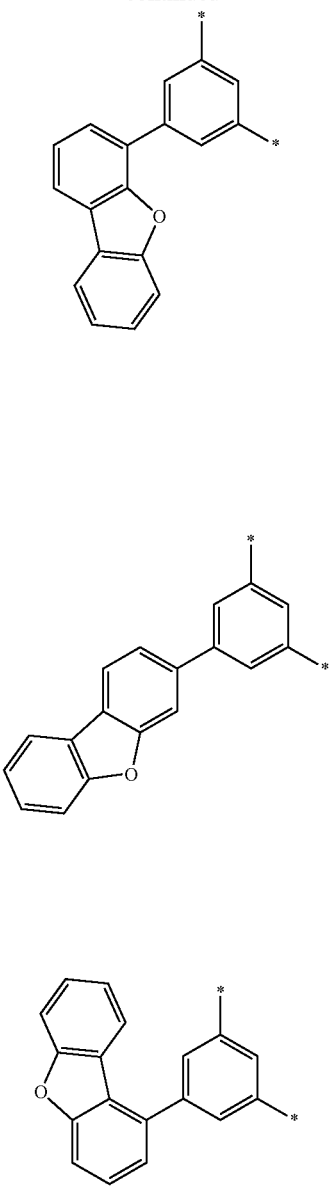

wherein Me is a methyl group.

In the formulae above, one occurrence of * represents a connection (i.e., a direct bond) to $L_2$. The other occurrence of * represents a connection (i.e., a direct bond) to the remainder of structure of Formula I (i.e., the trazine ring of Formula 1).

When the methyl group is present as a substituent in $L_1$, the compound for electron transport material can have a high glass transition temperature.

In another embodiment, $L_1$ may be a substituted or unsubstituted phenylene group or a substituted or unsubstituted naphthylene group. When $L_1$ has such a structure, the compound for electron transport material can have a high glass transition temperature.

Specifically, the compound for electron transport material represented by Formula 1 may be any one of compounds represented by the following structural formulae:

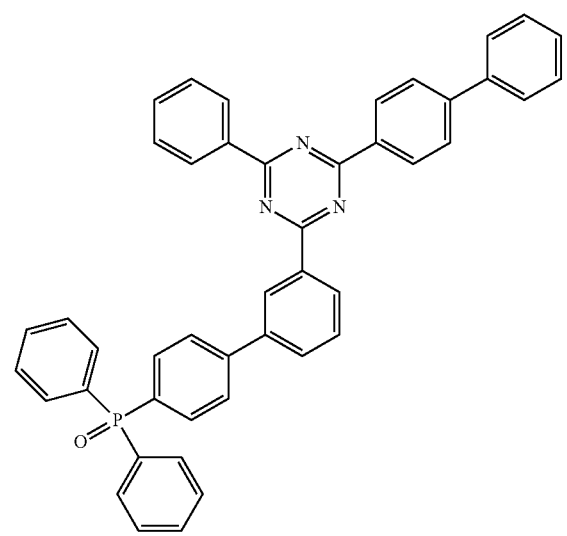
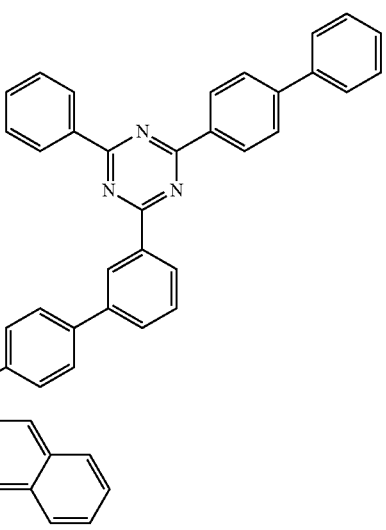
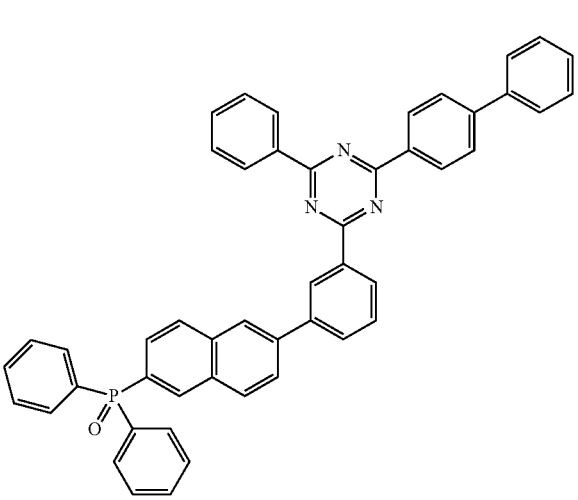
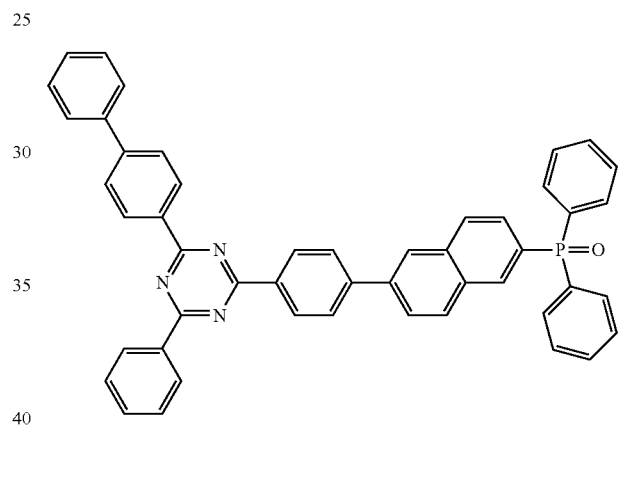
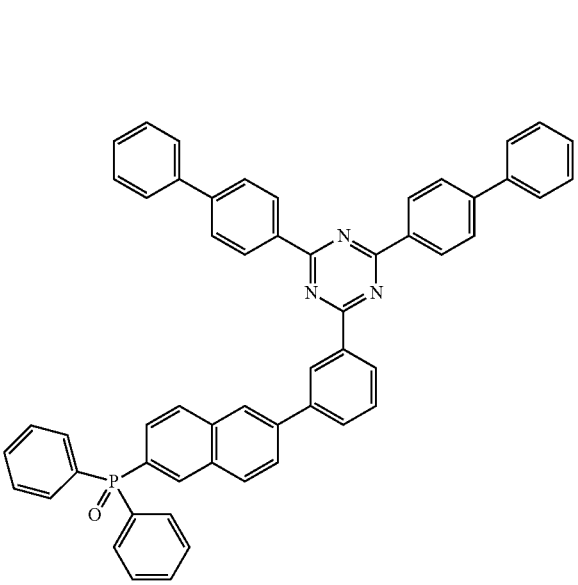
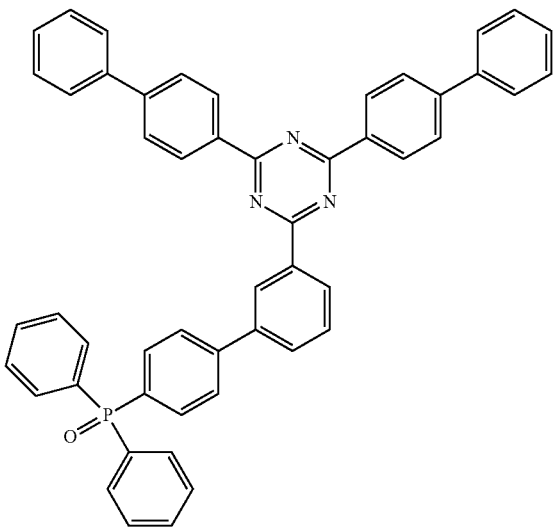

-continued

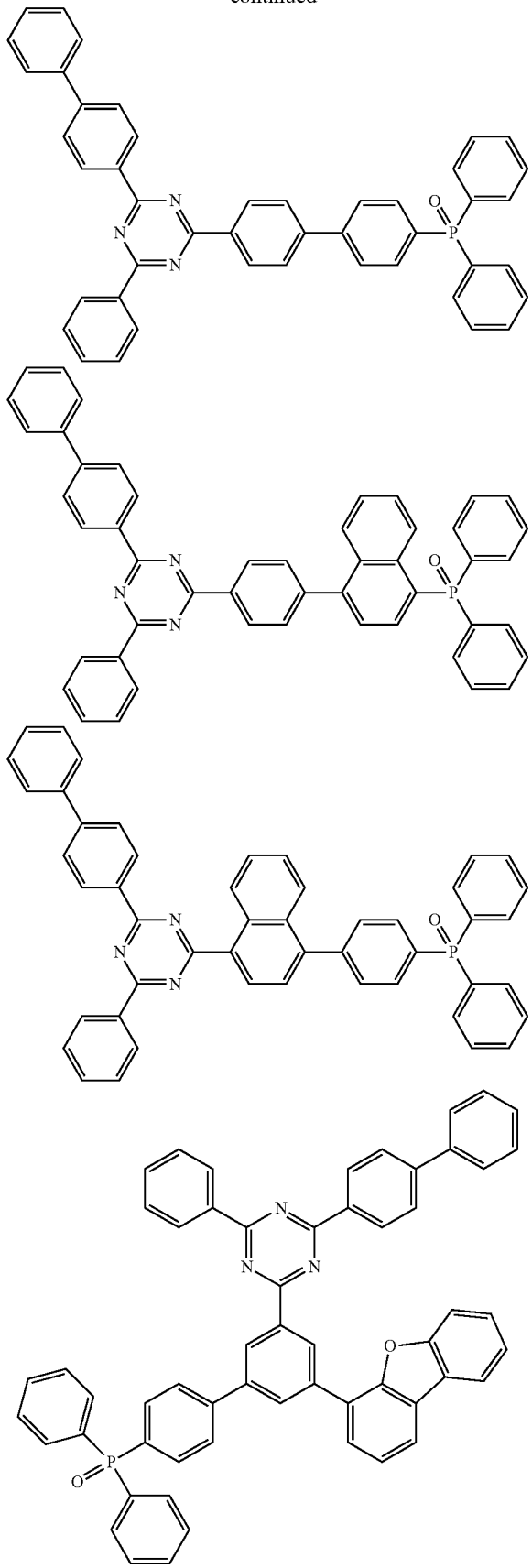

In accordance with another aspect of the present disclosure, there is provided an organic light emitting diode which includes an anode, a light emitting layer, an organic layer, and a cathode, wherein the organic layer includes an electron transport layer interposed between the light emitting layer and the cathode, and the electron transport layer includes the compound for electron transport material set forth above.

The organic light emitting diode includes the electron transport layer including the compound for electron transport material, as represented by Formula 1. As described above, since the compound of Formula 1 has high triplet energy while exhibiting good electron mobility and thermal stability, the organic light emitting diode has increased lifespan and good heat resistance. Accordingly, the organic light emitting diode is suitable for applications requiring harsh thermal conditions. For example, when used in automotive organic light emitting displays operating under harsh thermal conditions, the organic light emitting diode can exhibit good properties in terms of lifespan and heat resistance.

FIG. 1 shows an organic light emitting diode according to one embodiment of the present disclosure. Referring to FIG. 1, the organic light emitting diode 100 sequentially includes an anode 110, a light emitting layer 130, an organic layer 140, and a cathode 120.

The anode 110 provides holes to the light emitting layer 130. The anode 110 may include a conductive material having a high work function to easily provide holes. When the organic light emitting diode 100 is used in bottom-emission type organic light emitting displays, the anode 110 may be a transparent electrode formed of a transparent conductive material. When the organic light emitting diode 100 is used in top-emission type organic light emitting displays, the anode 110 may have a multilayer structure in which a reflective layer is stacked on a transparent electrode formed of a transparent conductive material.

The cathode 120 provides electrons to the light emitting layer 130. The cathode 120 may include a conductive material having a low work function to easily provide electrons. When the organic light emitting diode 100 is used in bottom-emission type organic light emitting displays, the cathode 120 may be a reflective electrode formed of a metal. When the organic light emitting diode 100 is used in top-emission type organic light emitting displays, the cathode 120 may be a transmissive electrode formed of a thin metal.

The light emitting layer (EML) 130 may emit red (R), green (G), or blue (B) light and may be formed of a phosphor or a fluorescent material.

When the light emitting layer 130 is configured to emit red light, the light emitting layer 130 may be formed of a phosphor that includes a host material including carbazole biphenyl (CBP) or 1,3-bis(carbazol-9-yl) (mCP) and a dopant material selected from the group consisting of bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), octaethylporphyrin platinum (PtOEP), and combinations thereof, or may be formed of a fluorescent material including PBD: $Eu(DBM)_3(Phen)$ or perylene, without being limited thereto.

When the light emitting layer 130 is configured to emit green light, the light emitting layer 130 may be formed of a phosphor that includes a host material including CBP or mCP and a dopant material including fac-tris(2-phenylpyridine)iridium $(Ir(ppy)_3)$, or may be formed of a fluorescent material including tris(8-hydroxyquinolino)aluminum (Alq3), without being limited thereto.

When the light emitting layer 130 is configured to emit blue light, the light emitting layer 130 may be formed of a phosphor that includes a host material including CBP or mCP and a dopant material including (4,6-F2ppy)$_2$Irpic or may be formed of a fluorescent material including any one selected from the group consisting of spiro-DPVBi, spiro-6P, distyrylbenzene (DSB), distyrylarylene (DSA), PFO-based polymers, PPV-based polymers, and combinations thereof, without being limited thereto.

The organic layer 140 may be an electron transport layer.

The electron transport layer receives electrons from the cathode 120. The electron transport layer transfers the received electrons to the light emitting layer 130.

The electron transport layer serves to facilitate transport of electrons and includes the compound for electron transport material, as represented by Formula 1, as an electron transport material.

Details of the compound for electron transport material, as represented by Formula 1, are the same as described above.

The electron transport layer may further include an additional compound for electron transport material other than said compound for electron transport material.

The electron transport layer may include the compound for electron transport material, as represented by Formula 1, as a first compound for electron transport material and the additional compound for electron transport material as a second compound for electron transport material.

The second compound for electron transport material includes an organic compound or an organometallic compound.

The organic compound may be a well-known electron transport material. The well-known electron transport material may be a material electrochemically stabilized when negatively ionized (i.e., upon gaining electrons). Alternatively, the well-known electron transport material may be a material generating stable radical anions. Alternatively, the well-known electron transport material may be a material that contains a heterocyclic ring and thus can be easily negatively ionized by heteroatoms.

For example, the organic compound may include at least one selected from among 2-(4-biphenylyl)-5-(4-tert-butylphenyl)-1,3,4oxadiazole) (PBD), 3-(4-biphenyl)4-phenyl-5-tert-butylphenyl-1,2,4-triazole (TAZ), Spiro-PBD, 2,2',2-(1,3,5-benzinetriyl)-tris(1-phenyl-1-H-benzimidazole) (TPBi), oxadiazole, triazole, phenanthroline, benzoxazole, benzthiazole, and combinations thereof, without being limited thereto.

For example, the organometallic compound may be an organoaluminum compound or an organolithium compound such as tris(8-hydroxyquinolino)aluminum (Alq3), 8-hydroxyquinolinolatolithium (Liq), bis(2-methyl-8-quinolinolate)-4-(phenylphenolato)aluminium (BAlq), or SAlq.

In one embodiment, the organometallic compound may be an organolithium compound.

More specifically, a ligand bonded to lithium in the organolithium compound may be a hydroxyquinoline-based ligand.

In the electron transport layer, a weight ratio of the first compound to the second compound may range from 90:10 to 10:90. Within this range, the electron transport layer can secure an appropriate level of electrons for achieving charge balance in the light emitting layer.

The electron transport layer may further include a well-known electron transport material in addition to the first and second compounds for electron transport material. The well-known electron transport material may be a material electrochemically stabilized when negatively ionized (i.e., upon gaining electrons). Alternatively, the well-known electron transport material may be a material that generates stable radical anions. Alternatively, the well-known electron transport material may be a material that contains a heterocyclic ring and thus can be easily negatively ionized by heteroatoms. For example, the well-known electron transport material may include at least one selected from the group consisting of tris(8-hydroxyquinolino)aluminum (Alq3), 8-hydroxyquinolinolatolithium (Liq), 2-(4-biphenylyl)-5-(4-tert-butylphenyl)-1,3,4oxadiazole (PBD), 3-(4-biphenyl) 4-phenyl-5-tert-butylphenyl-1,2,4-triazole (TAZ), Spiro-PBD, bis(2-methyl-8-quinolinolate)-4-(phenylphenolato) aluminium (BAlq), SAlq, 2,2',2-(1,3,5-benzinetriyl)-tris(1-phenyl-1-H-benzimidazole) (TPBi), oxadiazole, triazole, phenanthroline, benzoxazole, benzthiazole, and combinations thereof, without being limited thereto.

In addition to the electron transport layer, the organic layer 140 may further include any one selected from the group consisting of a hole injection layer, a hole transport layer, an electron blocking layer, a hole blocking layer, an electron injection layer, and combinations thereof. Each of the hole injection layer, the hole transport layer, the electron blocking layer, the hole blocking layer, the electron transport layer, and the electron injection layer may have a monolayer or multilayer structure.

Figure 2:
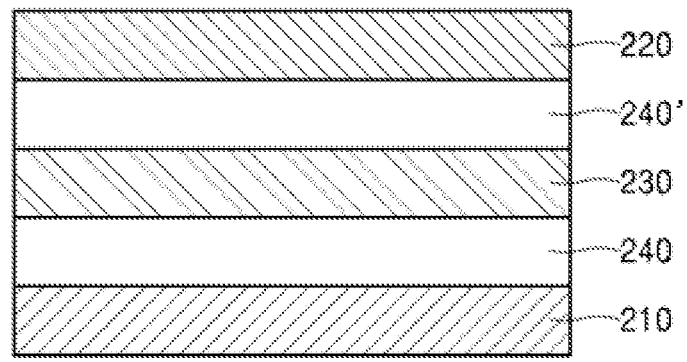
FIG. 2 shows an organic light emitting diode according to another embodiment of the present disclosure.

FIG. 2 shows an organic light emitting diode according to another embodiment of the present disclosure. Referring to FIG. 2, the organic light emitting diode 200 sequentially includes an anode 210, an organic layer 240, a light emitting layer 230, an organic layer 240' and a cathode 220. The organic layer 240 may be disposed between the anode 210 and the light emitting layer 230 and/or between the light emitting layer 230 and the cathode 220.

For example, as the organic layer 240, a hole injection layer, a hole transport layer, or an electron blocking layer may be interposed between the anode 210 and the light emitting layer 230. For example, as the organic layer 240', a hole blocking layer or an electron injection layer may be interposed between the light emitting layer 230 and the cathode 220.

The hole injection layer serves to facilitate injection of holes and may be formed of at least one selected from the group consisting of cupper phthalocyanine (CuPc), poly(3, 4)-ethylenedioxythiophene (PEDOT), polyaniline (PANI), N,N-dinaphthyl-N,N'-diphenyl benzidine (NPD), and combinations thereof, without being limited thereto.

The hole transport layer may include a material electrochemically stabilized when positively ionized (i.e., upon losing electrons). Alternatively, the hole transport material may be a material that generates stable radical cations. Alternatively, the hole transport material may be a material that contains aromatic amine and thus can be easily positively ionized. For example, the hole transport layer may include any one selected from the group consisting of N,N-dinaphthyl-N,N'-diphenyl benzidine (N,N'-bis(naphthalene-1-yl)-N,N'-bis(phenyl)-2,2'-dimethyl benzidine, NPD), N,N'-bis-(3-methylphenyl)-N,N'-bis-(phenyl)-benzidine (TPD), 2,2',7,7'-tetrakis(N,N-dimethylamino)-9,9-spirofluorene (spiro-TAD), 4,4',4-tris(N-3-methylphenyl-N-phenylamino)-triphenylamine (MTDATA), and combinations thereof, without being limited thereto.

The electron injection layer serves to facilitate injection of electrons and may include any one selected from the group consisting of tris(8-hydroxyquinolino)aluminum (Alq3), PBD, TAZ, Spiro-PBD, BAlq, SAlq, and combinations thereof, without being limited thereto. Alternatively, the electron injection layer 160 may be formed of a metal compound, which may include at least one selected from the group consisting of LiQ, LiF, NaF, KF, RbF, CsF, FrF, $BeF_2$, $MgF_2$, $CaF_2$, $SrF_2$, $BaF_2$, and $RaF_2$, without being limited thereto.

Figure 3:
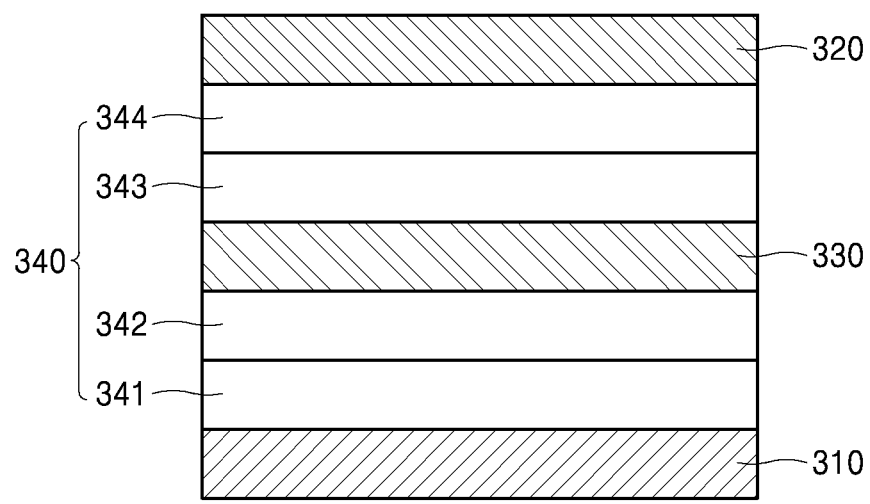
FIG. 3 shows an organic light emitting diode according to a further embodiment of the present disclosure.

FIG. 3 shows an organic light emitting diode according to a further embodiment of the present disclosure. Referring to FIG. 3, the organic light emitting diode 300 includes an organic layer 340 including a hole injection layer 341, a hole transport layer 342, an electron transport layer 343, and an electron injection layer 344. The organic light emitting diode 300 sequentially includes an anode 310, the hole injection layer 341, the hole transport layer 342, a light emitting layer 330, the electron transport layer 343, the electron injection layer 344, and a cathode 320. Details of each layer constituting the organic layer 340 are the same as described above.

Next, the present disclosure will be described in more detail with reference to examples. However, it should be noted that these examples are provided for illustration only and should not be construed in any way as limiting the disclosure.

EXAMPLES

In Preparative Examples 1 to 6, the following compounds A to F were prepared.

Compound A

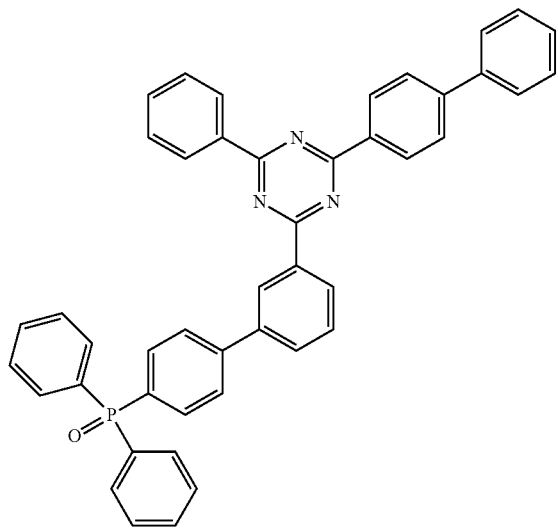

Compound B

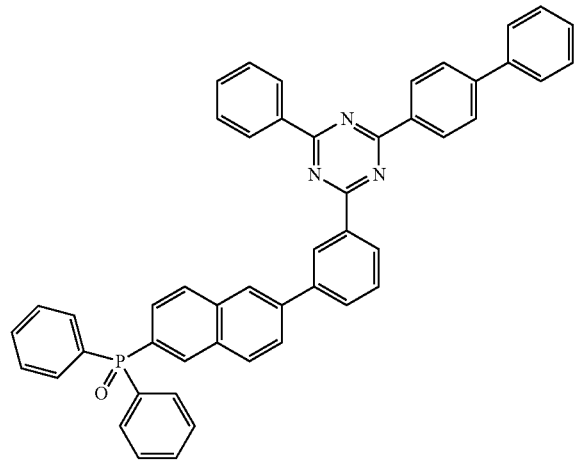

Compound C

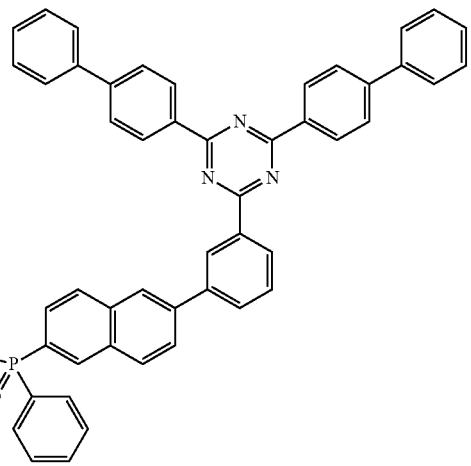

Compound D

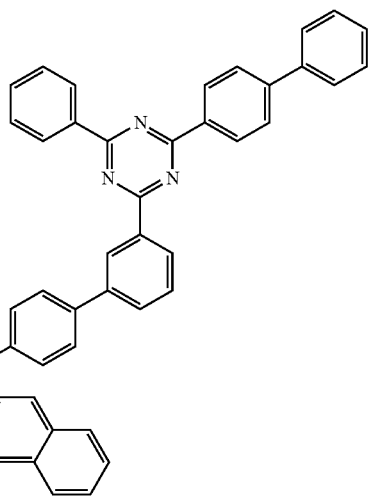

Compound E

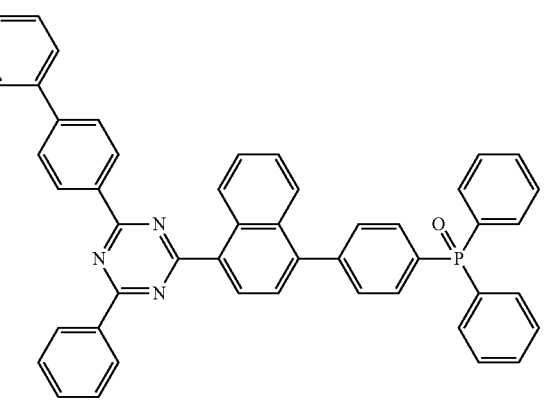

-continued

Compound F

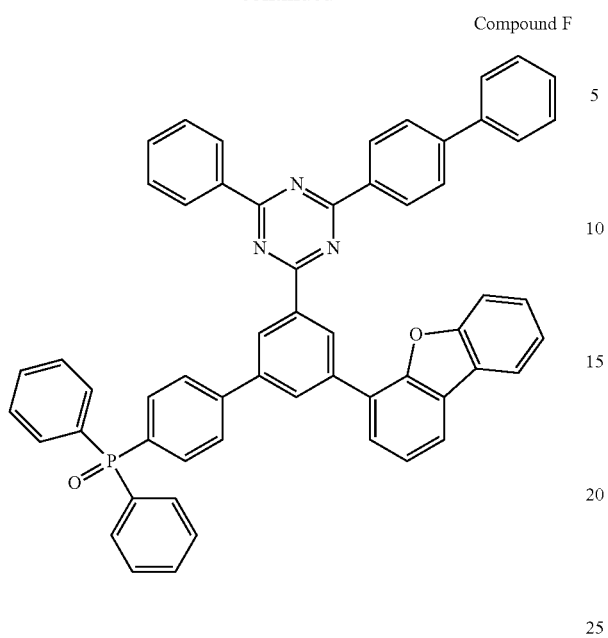

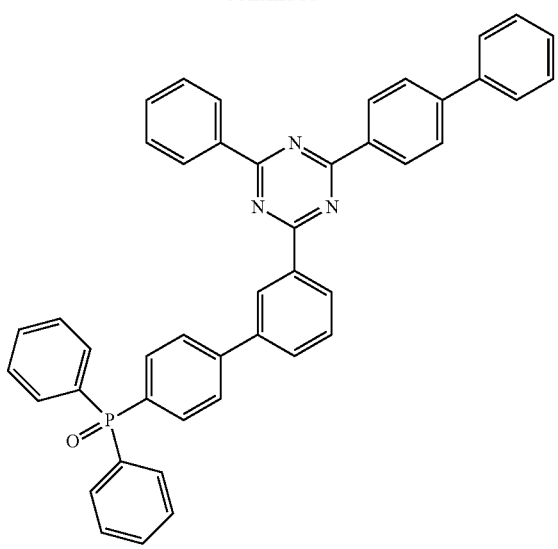

Preparative Example 1

Preparation of Compound A

Compound A was prepared as follows.

Reaction Formula 1

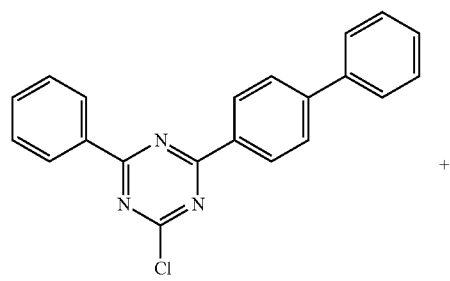

+

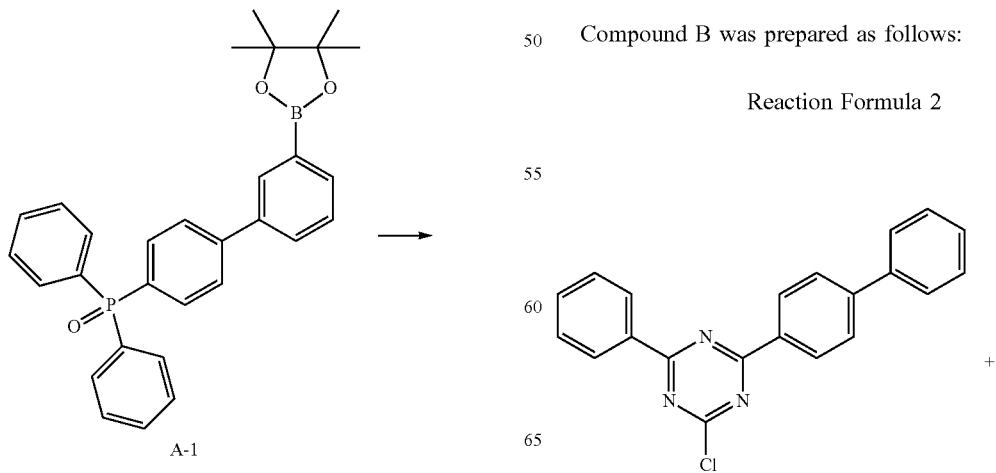

Into a 250 mL round bottom flask under an argon atmosphere, 3.0 g (8.7 mmol) of 2-chloro-4-(biphenyl-4-yl)-6-phenyl-1,3,5-triazine, 3.8 g (7.9 mmol) of A-1, 0.18 g (0.16 mmol) of $Pd(PPh_3)_4$, 12 mL of 2M $K_2CO_3$ aqueous solution, 90 mL of toluene, and 30 mL of tetrahydrofuran (THF) were placed, followed by stirring under reflux. After completion of reaction was verified by Thin Layer Chromatography (TLC), an organic layer was separated from the reaction solution, followed by distillation under reduced pressure, and then Compound A was obtained by column chromatography.

Preparative Example 2

Preparation of Compound B

Compound B was prepared as follows:

Reaction Formula 2

+

17
-continued

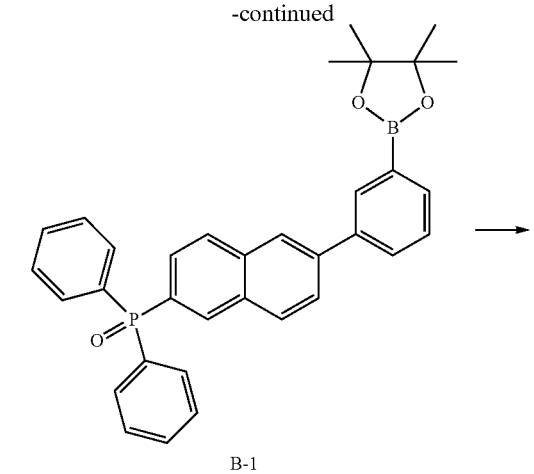

B-1

Into a 250 mL round bottom flask under an argon atmosphere, 3.0 g (8.7 mmol) of 2-chloro-4-(biphenyl-4-yl)-6-phenyl-1,3,5-triazine, 4.2 g (7.9 mmol) of B-1, 0.18 g (0.16 mmol) of Pd(PPh$_3$)$_4$, 12 mL of 2M K$_2$CO$_3$ aqueous solution, 90 mL of toluene, and 30 mL of THF were placed, followed by stirring under reflux. After completion of reaction was verified by TLC, an organic layer was separated from the reaction solution, followed by distillation under reduced pressure, and then Compound B was obtained by column chromatography.

18

Preparative Example 3

Preparation of Compound C

Compound C was prepared as follows.

Reaction Formula 3

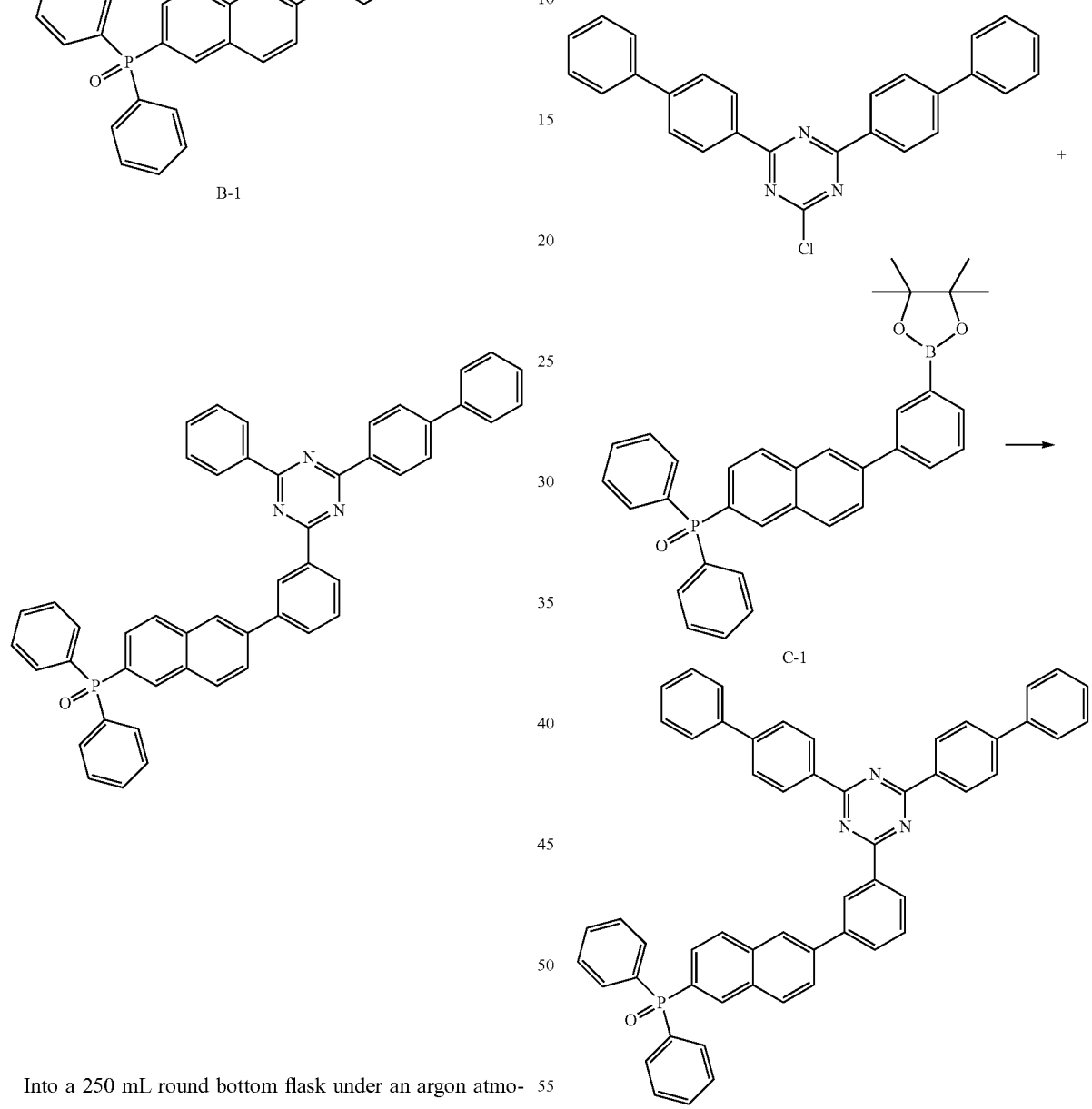

Into a 250 mL round bottom flask under an argon atmosphere, 4.5 g (10.7 mmol) of 2,4-bis((1,1'-biphenyl)-4-yl)-6-chloro-1,3,5-triazine, 5.2 g (9.7 mmol) of C-1, 0.25 g (0.21 mmol) of Pd(PPh$_3$)$_4$, 15 mL of 2M K$_2$CO$_3$ aqueous solution, 120 mL of toluene, and 45 mL of THF were placed, followed by stirring under reflux. After completion of reaction was verified by TLC, an organic layer was separated from the reaction solution, followed by distillation under reduced pressure, and then Compound C was obtained by column chromatography.

Preparative Example 4

Preparation of Compound D

Compound D was prepared as follows.

Reaction Formula 4

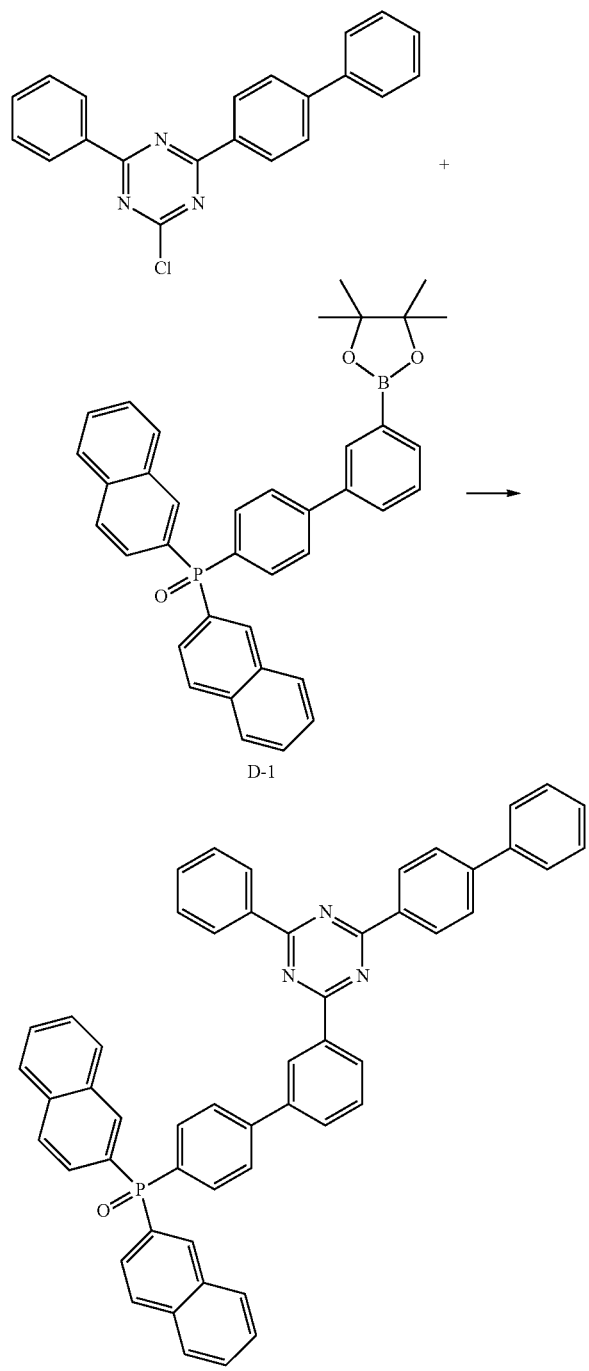

Into a 250 mL round bottom flask under an argon atmosphere, 3.0 g (8.7 mmol) of 2-chloro-4-(biphenyl-4-yl)-6-phenyl-1,3,5-triazine, 4.6 g (7.9 mmol) of D-1, 0.18 g (0.16 mmol) of Pd(PPh$_3$)$_4$, 12 mL of 2M K$_2$CO$_3$ aqueous solution, 120 mL of toluene, and 40 mL of THF were placed, followed by stirring under reflux. After completion of reaction was verified by TLC, an organic layer was separated from the reaction solution, followed by distillation under reduced pressure, and then Compound D was obtained by column chromatography.

Preparative Example 5

Preparation of Compound E

Compound E was prepared as follows.

Reaction Formula 5

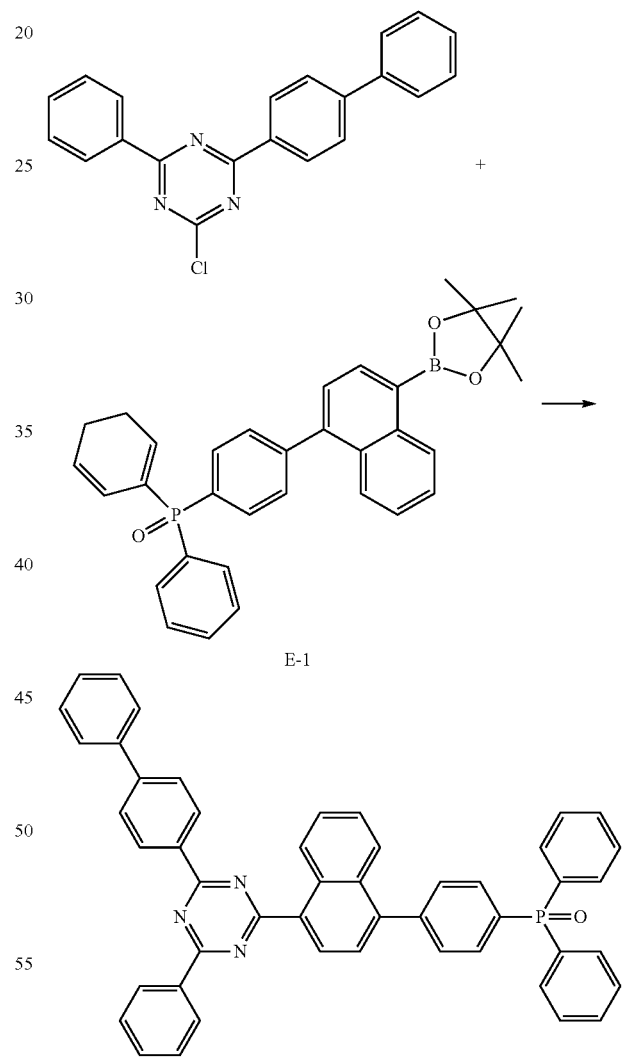

Into a 250 mL round bottom flask under an argon atmosphere, 3.0 g (8.7 mmol) of 2-chloro-4-(biphenyl-4-yl)-6-phenyl-1,3,5-triazine, 4.2 g (7.9 mmol) of E-1, 0.18 g (0.16 mmol) of Pd(PPh$_3$)$_4$, 12 mL of 2M K$_2$CO$_3$ aqueous solution, 120 mL of toluene, and 40 mL of THF were placed, followed by stirring under reflux. After completion of reaction was verified by TLC, an organic layer was separated from the reaction solution, followed by distillation under reduced pressure, and then Compound E was obtained by column chromatography.

Preparative Example 6

Preparation of Compound F

Compound F was prepared as follows.

Reaction Formula 6

Into a 250 mL round bottom flask under an argon atmosphere, 3.0 g (8.7 mmol) of 2-chloro-4-(biphenyl-4-yl)-6-phenyl-1,3,5-triazine, 5.1 g (7.9 mmol) of F-1, 0.18 g (0.16 mmol) of Pd(PPh$_3$)$_4$, 15 mL of 2M K$_2$CO$_3$ aqueous solution, 150 mL of toluene, and 50 mL of THF were placed, followed by stirring under reflux. After completion of reaction was verified by TLC, an organic layer was separated from the reaction solution, followed by distillation under reduced pressure, and then Compound F was obtained by column chromatography.

Example 1

A patterned indium-tin-oxide (ITO) glass was cleaned and then mounted in a vacuum chamber at a base pressure of 5×10$^{-8}$ torr to 7×10$^{-8}$ torr, followed by sequentially forming HAT-CN (100 Å), NPD (800 Å), β-ADN (200 Å, 4% BD-doped), Compound A (300 Å), LiF (5 Å), and Al (1000 Å) layers on the ITO glass through deposition of organic materials, thereby fabricating an organic light emitting diode.

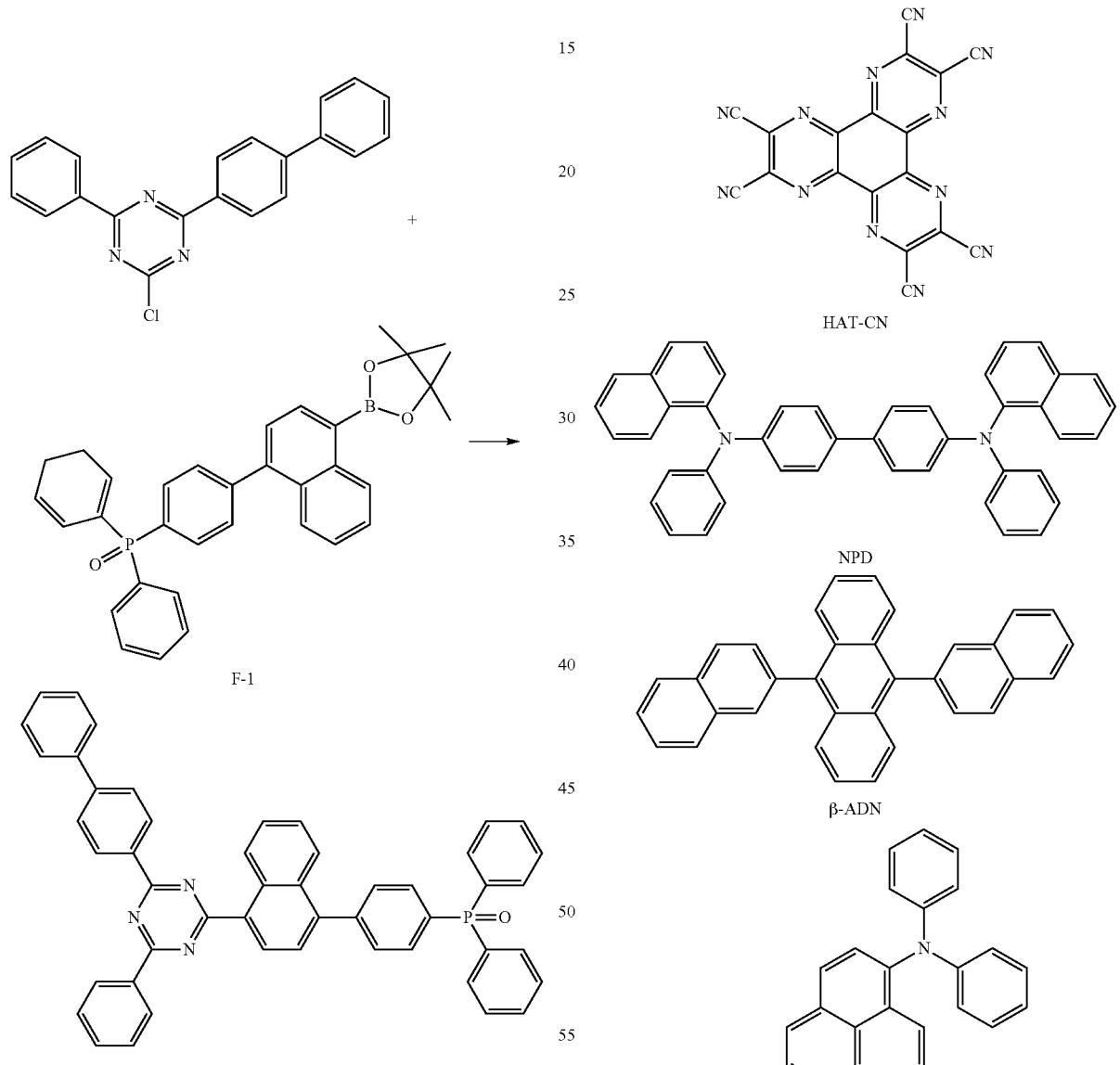

Example 2

An organic light emitting diode was fabricated in the same manner as in Example 1 except that Compound B was used instead of Compound A.

Example 3

An organic light emitting diode was fabricated in the same manner as in Example 1 except that Compound C was used instead of Compound A.

Example 4

An organic light emitting diode was fabricated in the same manner as in Example 1 except that Compound D was used instead of Compound A.

Example 5

An organic light emitting diode was fabricated in the same manner as in Example 1 except that Compound E was used instead of Compound A.

Example 6

An organic light emitting diode was fabricated in the same manner as in Example 1 except that Compound F was used instead of Compound A.

Comparative Example 1

An organic light emitting device was fabricated in the same manner as in Example 1 except that Compound ETM was used instead of Compound A.

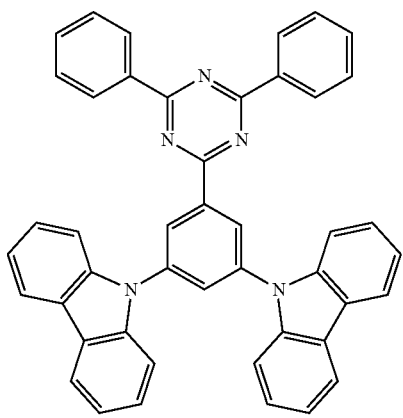

Compound ETM

EVALUATION

Experimental Example 1

Evaluation of Glass Transition Temperature and Electron Mobility

Compounds A to F prepared in Preparative Examples 1 to 6 were evaluated as to glass transition temperature and electron mobility. The differential scanning calorimetry (DSC) was carried out to determine glass transition temperature (Tg) of each organic compound.

Results are shown in Table 1.

TABLE 1

| Item | Glass transition temperature (° C.) |
|---|---|
| Compound A | 111 |
| Compound B | 127 |
| Compound C | 130 |
| Compound D | 131 |
| Compound E | 126 |
| Compound F | 135 |

As shown in FIG. 1, Compounds A to F exhibited good electron mobility while having a glass transition temperature of higher than 110° C. Therefore, it can be seen that Compounds A to F can exhibit good heat resistance while being useful as an electron transport material.

Experimental Example 2

Evaluation of Lifespan

The time ($T_{95}$) taken for the luminance (L) of each of the organic light emitting diodes fabricated in Examples 1 to 6 and Comparative Example 1 to reach 95% of initial luminance thereof ($L_0$, 3,000 nit) was measured. The value measured in Comparative Example 1 was set as 100% and the other measured values were converted relative thereto. Results are shown in Table 2.

TABLE 2

| Item | Lifespan (T95) [%] |
|---|---|
| Example 1 | 138 |
| Example 2 | 152 |
| Example 3 | 187 |
| Example 4 | 191 |
| Example 5 | 127 |
| Example 6 | 160 |
| Comparative Example 1 | 100 |

Figure 4:
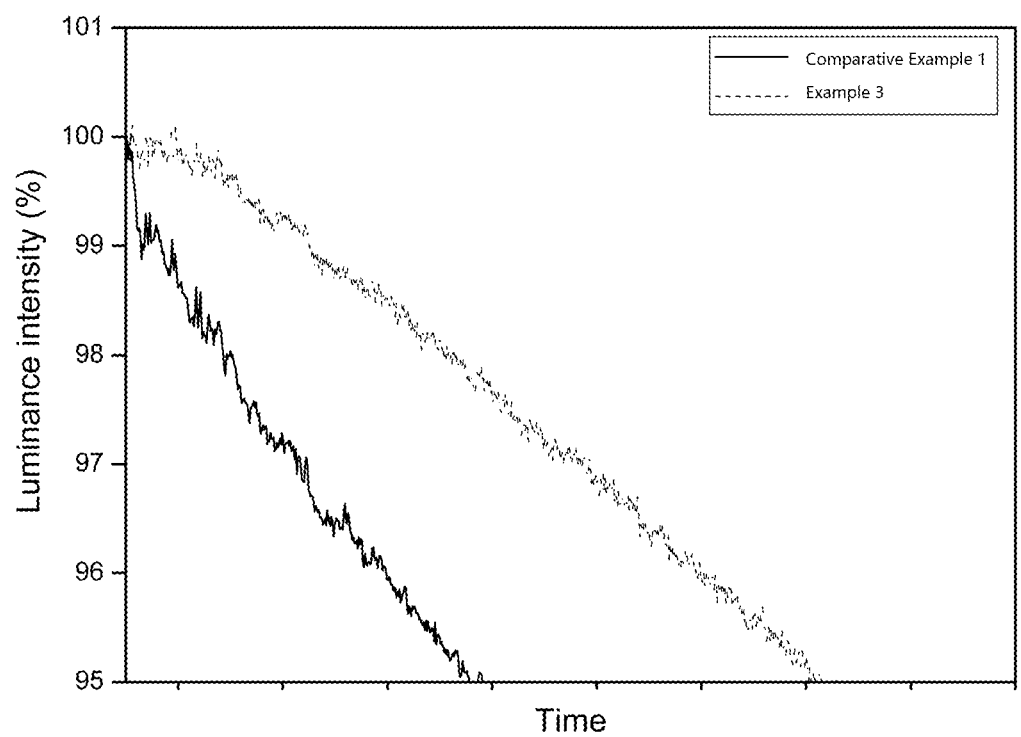
FIG. 4 is a graph showing difference in time-dependent luminance between Example 3 and Comparative Example 1.

FIG. 4 is a graph showing difference in time-dependent luminance between Example 3 and Comparative Example 1.

Figure 5:
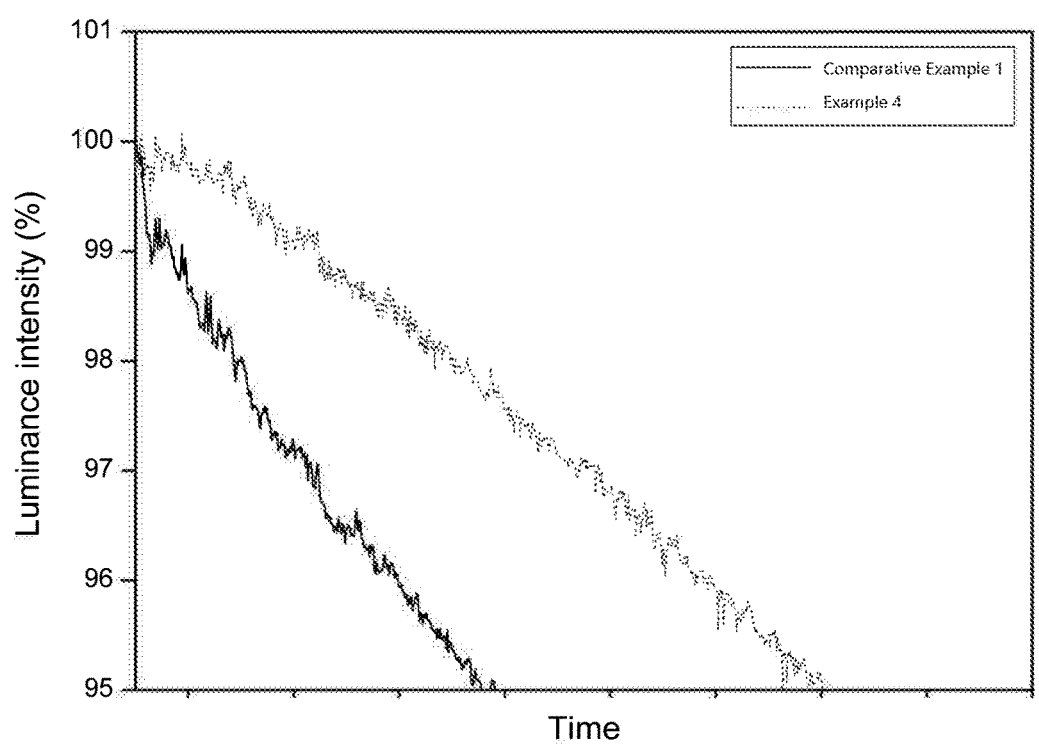
FIG. 5 is a graph showing difference in time-dependent luminance between Example 4 and Comparative Example 1.

FIG. 5 is a graph showing difference in time-dependent luminance between Example 4 and Comparative Example 1.

From the results shown in Table 2, it can be seen that the organic light emitting diodes of Examples 1 to 6 had good properties in terms of lifespan.

Although the present disclosure has been described with reference to some embodiments in conjunction with the accompanying drawings, it should be understood that the foregoing embodiments are provided for illustration only and are not to be in any way construed as limiting the present disclosure, and that various modifications, changes, alterations, and equivalent embodiments can be made by those skilled in the art without departing from the spirit and scope of the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting diode, comprising:
   an anode;
   a light emitting layer;
   an organic layer; and
   a cathode,
   wherein the organic layer comprises an electron transport layer interposed between the light emitting layer and the cathode, and the electron transport layer consists of a compound having one of the following structures:

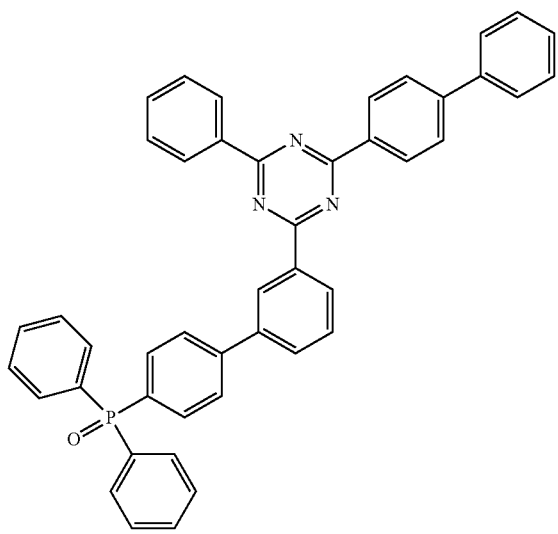

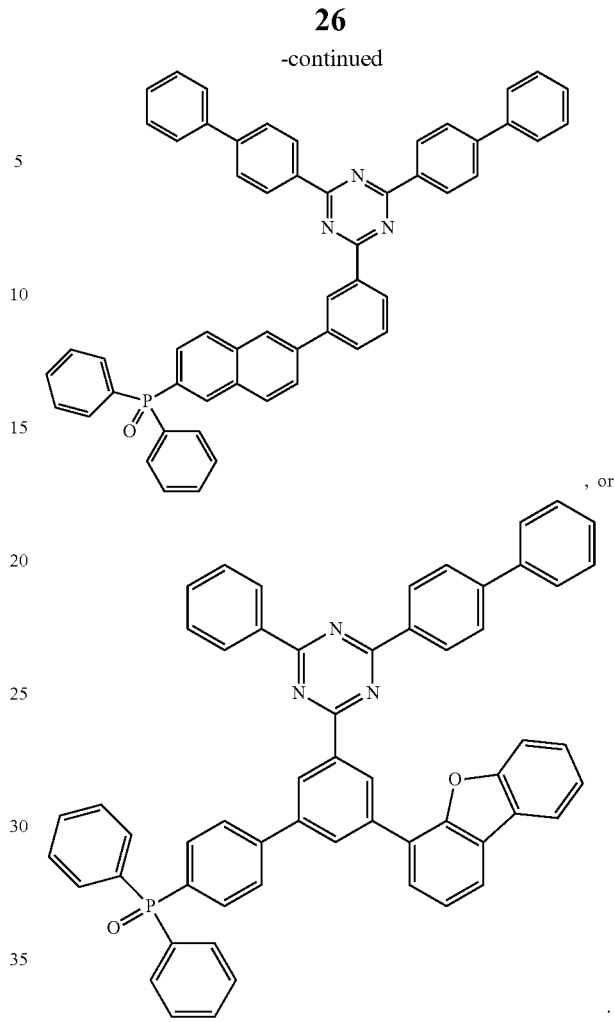

, or

.

2. The organic light emitting diode according to claim 1, wherein the compound has a glass transition temperature of 127° C. to 135° C.

3. The organic light emitting diode according to claim 1, wherein the organic layer further comprises a layer selected from the group consisting of a hole injection layer, a hole transport layer, an electron blocking layer, a hole blocking layer, an electron injection layer, and combinations thereof.

* * * * *

UNITED STATES PATENT AND TRADEMARK OFFICE
CERTIFICATE OF CORRECTION

PATENT NO. : 11,795,185 B2
APPLICATION NO. : 16/216647
DATED : October 24, 2023
INVENTOR(S) : Dohan Kim et al.

Page 1 of 2

It is certified that error appears in the above-identified patent and that said Letters Patent is hereby corrected as shown below:

In the Claims

Column 25, Claim 1, Lines 24-45:

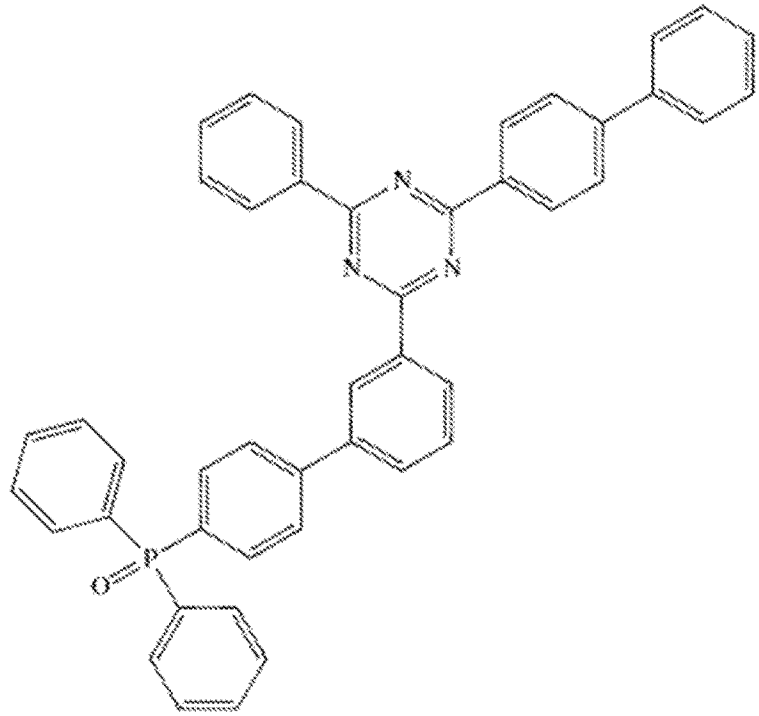

Signed and Sealed this
Twenty-fifth Day of February, 2025

Coke Morgan Stewart
*Acting Director of the United States Patent and Trademark Office*

CERTIFICATE OF CORRECTION (continued)
U.S. Pat. No. 11,795,185 B2

Should read:

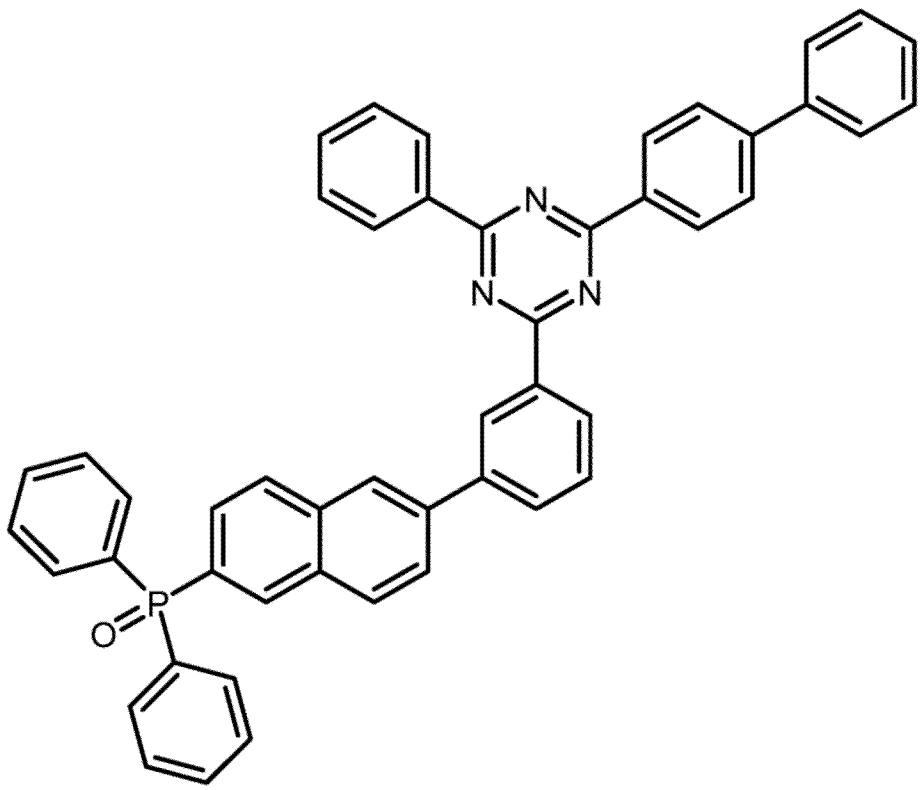

-- --